United States Patent [19]

Negita

[11] 4,176,030
[45] Nov. 27, 1979

[54] METHOD FOR FORMING A QUARTZ CRYSTAL VIBRATOR

[75] Inventor: Mutsumi Negita, Minowa, Japan

[73] Assignee: Matsushima Kogyo Kabushiki Kaisha, Tokyo, Japan

[21] Appl. No.: 900,222

[22] Filed: Apr. 26, 1978

Related U.S. Application Data

[62] Division of Ser. No. 801,982, May 31, 1977.

[30] Foreign Application Priority Data

May 31, 1976 [JP] Japan .................................. 51-63135

[51] Int. Cl.$^2$ ............................................. C23C 15/00
[52] U.S. Cl. ............................... 204/192 R; 204/192 C; 29/25.35
[58] Field of Search ............... 204/192 R, 192 C; 156/650–652, 657; 427/123–125; 310/366, 370; 29/25.35

[56] References Cited

U.S. PATENT DOCUMENTS 4,099,078   7/1978   Shibata et al. ...................... 310/361

Primary Examiner—Aaron Weisstuch
Attorney, Agent, or Firm—Blum, Kaplan, Friedman, Silberman and Beran

[57] ABSTRACT

A quartz crystal tuning fork vibrator having thin conductive film side electrodes and a method of forming same is provided. The quartz crystal vibrator is provided with identically configured electrodes on both planar surfaces of the tuning fork tines with the electrodes being peripherally positioned along the respective lengthwise extents of the tines on both planar surfaces with thin conductive film electrodes being disposed on the lengthwise side surfaces of the tines in order to electrically couple the like configured electrodes peripherally disposed on the planar surfaces to each other. The quartz crystal plate and the electrodes formed on the opposed planar surfaces of the tines are formed by photo-etching, whereafter the planar surfaces are masked and a thin conductive film is sputtered on the lengthwise edges to form the electrodes on the side surfaces.

3 Claims, 13 Drawing Figures

METHOD FOR FORMING A QUARTZ CRYSTAL VIBRATOR

This is a division of application Ser. No. 801,982, filed May 31, 1977.

BACKGROUND OF THE INVENTION

This invention is directed to a tuning fork quartz crystal vibrator having like configured in-phase electrodes formed on the opposed planar surfaces of the tines and electrodes formed on the side surfaces of the tines to electrically couple the electrodes on the respective surfaces of the tines together and, in particular, to a method for forming the electrodes on at least the lengthwise side surface of the tines by masking the opposed planar surfaces of the vibrator and sputtering thin film conductive electrodes on the side surfaces of the tines.

Heretofore, subminiaturized quartz crystal vibrators, having high frequencies of vibration, have been manufactured by photo-etching techniques to thereby reduce the costs of manufacturing the vibrator and, at the same time, increase the reliability thereof. Such photo-etching processes include the steps of forming a thin film of conductive material in the shape of the vibrator on a quartz crystal plate, the conductive material being selected to be resistant to the etchant utilized to cut the quartz crystal. Thereafter, a photo-resist in the shape of the electrode is formed on the respective conductive layers. Next, the shape of the tuning fork quartz crystal vibrator is formed by utilizing a suitable etchant, whereafter a further etchant is utilized to remove the portions of the conductive material and, thereby, define the electrodes on the opposed planar surfaces of the vibrator. Nevertheless, a less than completely satisfactory result, of this method of manufacturing, is that the quartz crystal vibrator formed thereby has a reduced equivalent capacitance. It is noted that a characteristic of oscillator circuits, having quartz crystal vibrators therein, is that the lower the equivalent capacitance, the smaller the range over which the oscillating frequency, produced by the oscillator circuit, can be varied. Accordingly, a quartz crystal vibrator construction and method for forming same, that permits an increase in the equivalent capacitance of the quartz crystal vibrator and, hence, a resulting increase in the range of frequencies over which an oscillator circuit including same can be tuned, is desired.

SUMMARY OF THE INVENTION

Generally speaking, in accordance with the instant invention, a tuning fork vibrator having thin film electrodes along the lengthwise sides of the vibrator tines, for increasing the equivalent capacitance of the vibrator, and the method of forming such a vibrator, are provided. The vibrator is particularly characterized by a quartz crystal plate photo-etched to define a tuning fork vibrator, having two vibratory tines including first and second opposed substantially planar surfaces and side surfaces between the respective opposed planar surfaces of the tines. Both planar surfaces of each tine have at least two electrodes formed thereon, with the electrodes on both surfaces of each tine being in-phase, like configured and peripherally disposed along the lengthwise extents of the tines. Thin conductive film electrodes are formed on at least the lengthwise side surfaces of the tines for electrically coupling the respective like configured electrodes on both surfaces to each other.

Once the vibrator and electrodes thereon are formed by photo-etching, the opposed surfaces of the vibrator and electrodes disposed thereon are masked, and thereafter, a thin conductive film is sputtered on the sides of the vibrator to thereby form thin film conductive electrodes on, at least, the lengthwise side surfaces of the tines.

Accordingly, it is an object of the instant invention to provide an improved quartz crystal vibrator and method of forming same.

A further object of the instant invention is to provide an improved quartz crystal vibrator wherein thin film conductive electrodes are formed on the side surfaces of the tines in order to reduce the equivalent capacitance of the vibrator.

Still a further object of the instant invention is to provide an improved method of sputtering the sides of the tines to form thin film conductive electrodes thereon.

Another object of the instant invention is to provide an improved quartz crystal vibrator wherein the equivalent capacitance of the vibrator is increased, thereby increasing the range of frequency over which a quartz crystal oscillator circuit, including such a quartz crystal vibrator, can be tuned.

Still other objects and advantages of the invention will in part be obvious and will in part be apparent from the specification.

The invention accordingly comprises the several steps and the relation of one or more of such steps with respect to each of the others, and the apparatus embodying features of construction, combination of elements and arrangement of parts which are adapted to effect such steps, all as exemplified in the following detailed disclosure, and the scope of the invention will be indicated in the claims.

BRIEF DESCRIPTION OF THE DRAWINGS

For a fuller understanding of the invention, reference is had to the following description taken in connection with the accompanying drawings, in which.

DETAILED DESCRIPTION OF THE PREFERRED EMBODIMENTS

Figure 1:
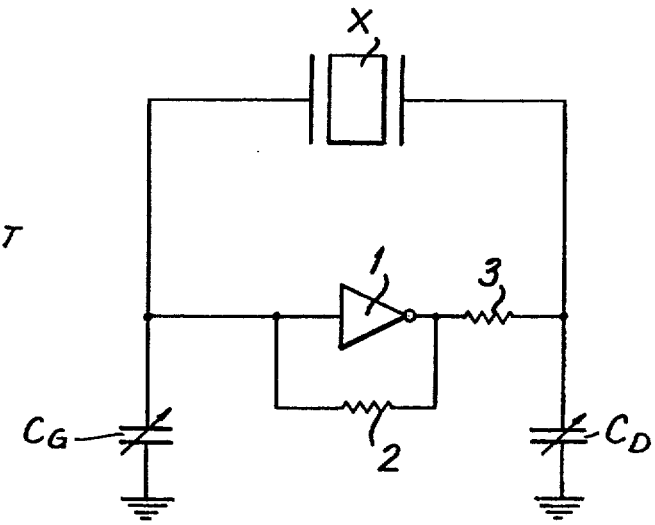
FIG. 1 is a circuit diagram of a quartz crystal oscillator circuit constructed in accordance with the prior art.

Reference is now made to FIG. 1, wherein a quartz crystal oscillator circuit, constructed in accordance with the prior art, is depicted. The quartz crystal oscillator circuit includes a quartz crystal vibrator X as a time standard. A C-MOS inverter circuit 1 and a feedback resistor 2, in parallel therewith, are series coupled with a resistor 3, in parallel with the quartz crystal vibrator X. A variable drain output capacitor $C_D$ and a variable gate input capacitor $C_G$ are provided for effecting tuning of the quartz crystal oscillator circuit in a well known manner.

In oscillating circuitry, of the type depicted in FIG. 1, adjustment of the oscillating frequency is effected by varying the gate and drain capacitors $C_G$ and $C_D$. The change in oscillating frequency $\Delta f$ equals $f_{osc} - f_s$ and is expressed as $f_s \cdot (C_1/2(C_0+C_1))$ wherein the load capacitance $C_1$ is approximately $(C_C \cdot C_G)/(C_D+C_G)$; $f_{osc}$ is the frequency of oscillation of the oscillator circuit; $f_s$ is the frequency of the quartz crystal vibrator; $C_1$ is the equivalent capacitance of the quartz crystal vibrator; and $C_0$ is the electrostatic capacitance of the quartz crystal vibrator. Accordingly, the specific equations detailed above demonstrate that the range over which the frequencies of the oscillator circuit are varied, as $C_G$ and $C_D$ are varied, are determined by the equivalent capacitance of the vibrator $C_1$. Specifically, if the value of the equivalent capacitance $C_1$ is large, the range over which the frequency of the oscillator circuit can be tuned is increased, thereby providing a more efficient quartz crystal oscillator circuit. Nevertheless, oscillator circuitry utilizing a quartz crystal vibrator, having a low equivalent capacitance $C_1$, such as those formed by photo-etching, considerably narrow the range of frequencies over which the vibrator can be tuned by varying the gate and drain capacitances $C_G$ and $C_D$ and, accordingly, provide a less efficient quartz crystal oscillator circuit.

It is noted however that quartz crystal vibrators, formed by photo-etching, have been found to be more reliable and more suitable for subminiaturization. Such vibrators are formed by the following four step process. First, a thin conductive layer is formed on the quartz crystal plate in the form of a tuning fork vibrator. The thin conductive film material is selected to be resistant to the etchant utilized to cut the quartz crystal. Thereafter, a photo-resist layer is formed on the conductive layer in the shape of the electrodes. Then, the quartz crystal vibrator is cut into the shape of a tuning fork by a suitable etchant. The final step includes the application of a further etchant to remove the thin film conductive material not covered by photo-resist to thereby form the electrodes on the opposed planar surfaces of the vibrator.

It has been found that the orientation of the quartz crystal plate causes corrosion along the Z-axis direction, rendering it necessary to utilize a Z-cut of NT-cut quartz crystal with the side surfaces of the plate free of electrodes when the quartz crystal vibrator is formed by the above-detailed photo-etching process. Nevertheless, efficient photo-etched quartz crystal vibrators having distinct electrode configurations, for generating electric fields in the vibrator tines, and which are free of electrodes on the side surfaces, have been developed.

Figure 2A:
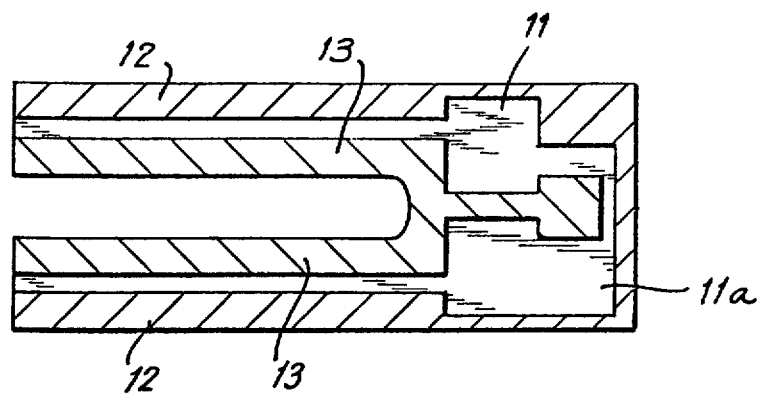
FIGS. 2a, 2b and 2c are respectively plan, plan and sectional view of a quartz crystal vibrator constructed in accordance with the prior art.
Figure 2B:
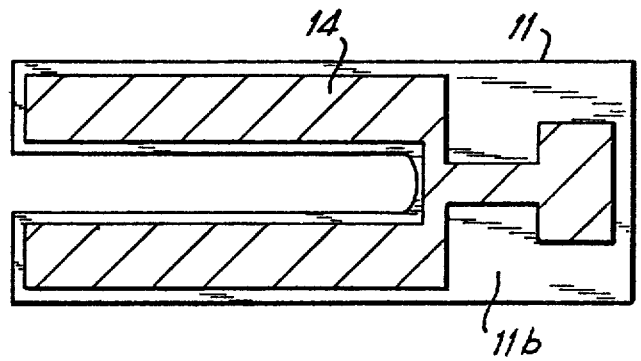
Figure 2C:
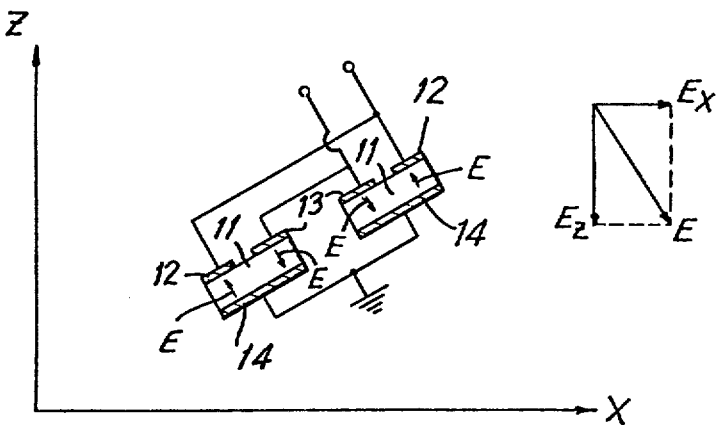

For example, reference is made to FIGS. 2a, 2b and 2c, wherein a quartz crystal vibrator that is free of electrodes on the side surfaces and is constructed in accordance with the prior art, is depicted. As is illustrated in FIG. 2a, the front surface of the vibrator includes U-shaped electrodes 12 and 13 on the front surface 11a of the quartz crystal plate 11. As is illustrated in FIG. 2b, a U-shaped electrode 14 is disposed on the rear surface 11b of the quartz crystal plate 11 to generate an electric field between the U-shaped electrodes 12 and 13, on the front surface, and the U-shaped electrodes extending across the tines on the rear surface, to thereby effect a flexural vibration of the tines toward and away from each other. It is noted that in quartz crystal vibrators of this type, the X-axis component $E_x$ of the electric field E is principally responsible for the vibration of the tines toward and away from each other. Accordingly, such vibrators are not sufficiently efficient and have an undesirable motional impedance. More importantly, quartz crystal vibrators, of the type illustrated in FIGS. 2a through 2c, have a small equivalent capacitance $C_1$.

Figure 3A:
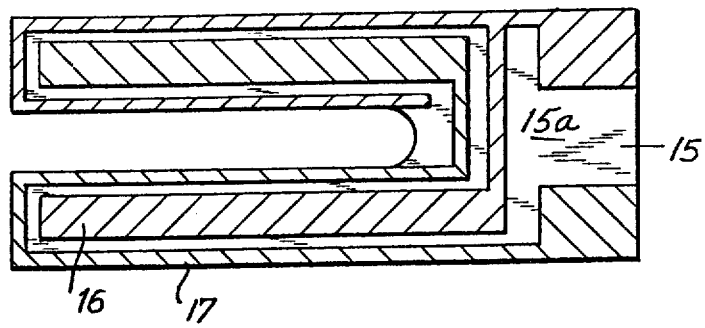
FIGS. 3a, 3b and 3c are respectively plan, plan and sectional views of a quartz crystal vibrator constructed in accordance with the prior art.
Figure 3B:
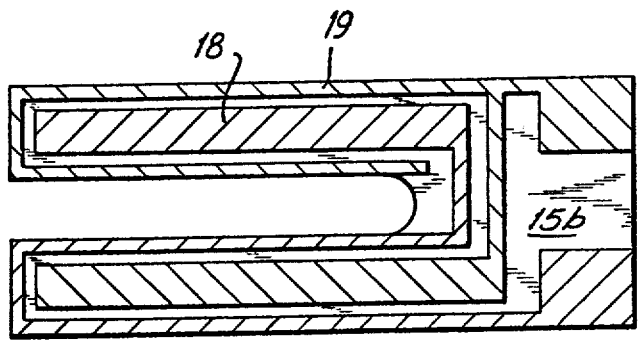
Figure 3C:
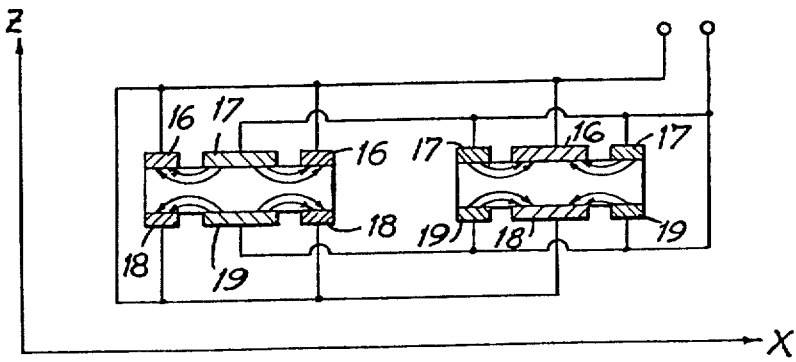

An example of a quartz crystal vibrator having a high degree of efficiency, but a low equivalent capacitance, is illustrated in FIGS. 3a through 3c. The electrode configuration on the front surface 15a of the vibrator 15, comprised of electrodes 16 and 17, is identically configured with the electrode configuration on the bottom surface of the vibrator 15, comprised of electrodes 18 and 19. As is best illustrated in FIG. 3c, electrodes 16 and 18 are disposed along the peripheral edge of a first tine, extend along the non-vibratory base portion of the vibrator and are disposed along the intermediate portion of the other tine. Similarly, electrodes 17 and 18 are disposed intermediate electrodes 16 and 19 and not in contact therewith on the first tine and extend along the non-vibratory base portion to the other tine wherein these electrodes are respectively disposed along the peripheral edges of the other tines, out of contact with the electrodes 16 and 19, disposed on the intermediate portion of the other tine. By such configuration, the electric fields in the respective tines are in-phase and have a major component in a direction substantially parallel to the opposed planar surfaces of the tines to thereby impart a greater flexural vibration to the tines of the vibrator toward and away from each other than that obtainable with the vibrator illustrated in FIGS. 2a through 2c. Although the equivalent capacitance $C_1$ of the vibrator, illustrated in FIGS. 3a through 3c, is larger than the equivalent capacitance of the quartz crystal vibrator, illustrated in FIGS. 2a through 2c, when compared with larger quartz crystal vibrators, formed by mechanical processes with electrodes on the front, rear and side surfaces, the equivalent capacitance of the quartz crystal vibrator, illustrated in FIGS. 3a through 3c, is considerable smaller, and as detailed above, substantially reduces the range of frequencies over which an oscillator circuit, utilizing such a vibrator, can be tuned.

Although the forming of quartz crystal vibrators by photo-etching has permitted vibrators of the type depicted in FIGS. 2a through 2c and FIGS. 3a through 3c to be miniaturized and has resulted in improved efficiency and operation, it has been found that quartz crystal vibrators entirely formed by photo-etching have a reduced equivalent capacitance, which reduced equivalent capacitance reduces the range over which the oscillating frequency of an oscillator circuit, utilizing such a vibrator, can be tuned. Accordingly, the reduced equivalent capacitance that obtains from forming the vibrator by photo-etching has limited uses. The instant invention overcomes the disadvantages noted above with respect to quartz crystal vibrators manufactured by photo-etching by disposing a thin conductive film of about several hundred A to several μm on the side surfaces of the tines of quartz crystal plate in a manner discussed in detail below, in order to obtain a quartz crystal vibrator with an increased equivalent capacitance.

Figure 4A:
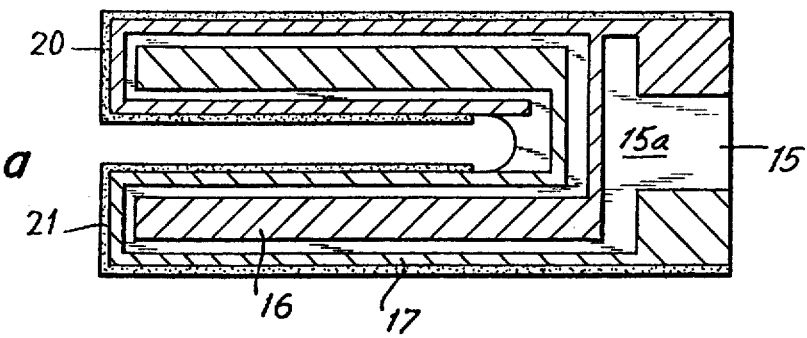
FIGS. 4a, 4b and 4c are respectively plan, plan and sectional views of a quartz crystal vibrator constructed in accordance with the preferred embodiment of the instant invention.
Figure 4B:
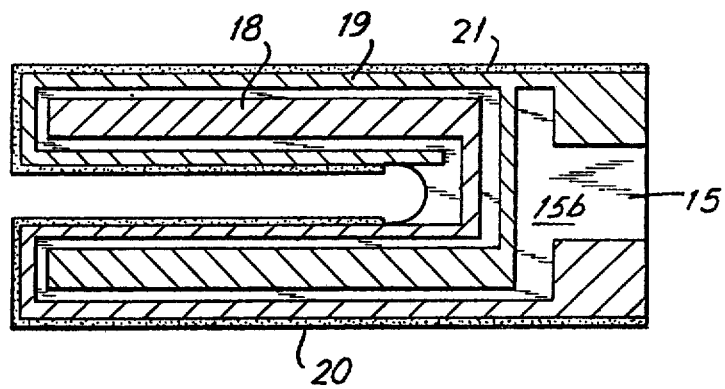
Figure 4C:
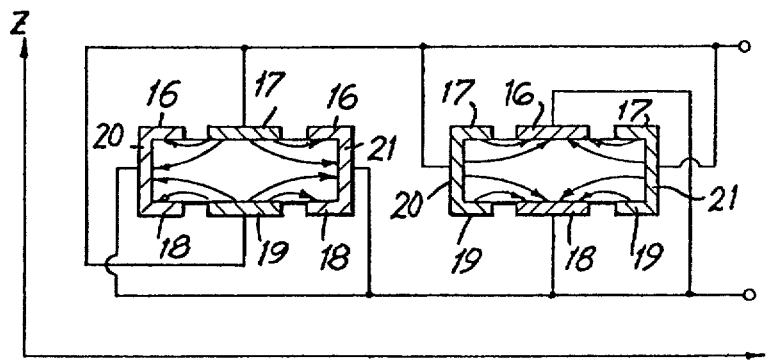

Reference is now made to FIGS. 4a through 4c, wherein a quartz crystal vibrator, constructed in accordance with a preferred embodiment of the instant invention, is depicted, like reference numerals being utilized to denote like elements depicted above. Side electrodes 20 and 21 are disposed on the side surfaces of the tines and are comprised of a conductive thin film. By utilizing side electrodes 20 and 21, the X-axis components of the electric field, generated between the respective electrodes on the opposed planar surfaces of the vibrator, are increased, thereby resulting in a likewise increase in the equivalent capacitance of the vibrator.

Figure 5:
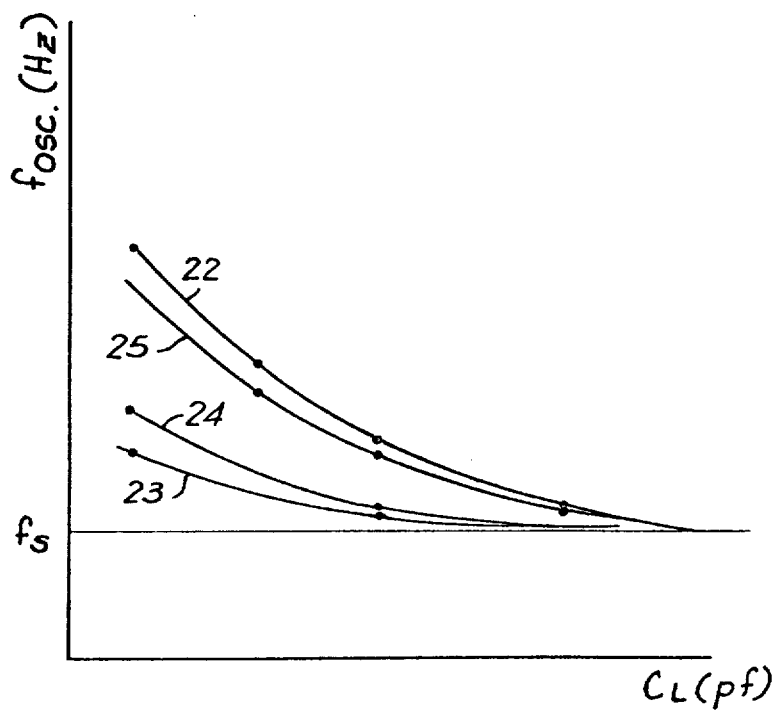
FIG. 5 is a graphical comparison of the various ranges of frequencies over which quartz crystal oscillator circuits, utilizing specific quartz crystal vibrators as a time standard, are effected.

Referring specifically to FIG. 5, the manner in which a photo-etched quartz crystal vibrator, having side electrodes in accordance with the instant invention, can be utilized in an oscillator circuit to be tuned to a wider range of frequencies, is illustrated. Curve 22 illustrates the range over which the quartz crystal oscillator circuit, depicted in FIG. 1, can be tuned utilizing the tuning fork vibrator manufactured by mechanical cutting processes and having electrodes on each of the surfaces. In contrast thereto, curve 23 illustrates the range of frequencies over which an oscillator circuit, utilizing the quartz crystal vibrator illustrated in FIGS. 2a through 2c, is varied over the same capacitance range as the mechanical vibrator illustrated by curve 22. Similarly, curve 24 illustrates the range of frequencies over which a quartz crystal oscillator circuit, utilizing the quartz crystal vibrator depicted in FIGS. 3a through 3c is varied, and curve 25 illustrates the range of frequencies over which a quartz crystal oscillator circuit utilizing a quartz crystal vibrator, constructed in accordance with the instant invention, is varied over the same capacitance range illustrated by the curve 22. It is readily observed that a quartz crystal vibrator formed by photo-etching, having thin conductive film electrodes on the side surfaces, is capable of permitting a tuning fork vibrator to be tuned over a range of frequencies that approximate that heretofore only obtainable in quartz crystal vibrators that were formed by mechanical cutting processes.

Accordingly, the following advantages are obtained by utilizing thin conductive electrodes on the side surfaces of the vibrator. The range of frequencies over which a quartz crystal oscillator circuit can be tuned is increased. Secondly, it becomes considerably easier to compensate for frequency shifts caused by aging and by the hermetical enclosure once the oscillator circuit is tuned to a specific frequency. Thirdly, in highly accurate quartz crystal oscillator circuits, in order to stabilize the oscillating frequency of the circuitry caused by changes in ambient temperature, capacitors having temperature compensating characteristics, such as $B_aTiO_3$ capacitors, are utilized in combination with the quartz crystal vibrators to eliminate changes in the oscillating frequency of the oscillator circuit resulting from changes in temperature. It is noted however that such temperature compensation is not easily obtainable with prior art quartz crystal vibrators of the type detailed above. Nevertheless, because of the increased range of frequency adjustment that inures to a quartz crystal vibrator, constructed in accordance with the instant invention, the above noted disadvantages of prior art quartz crystal vibrators are substantially eliminated.

Figure 6A:
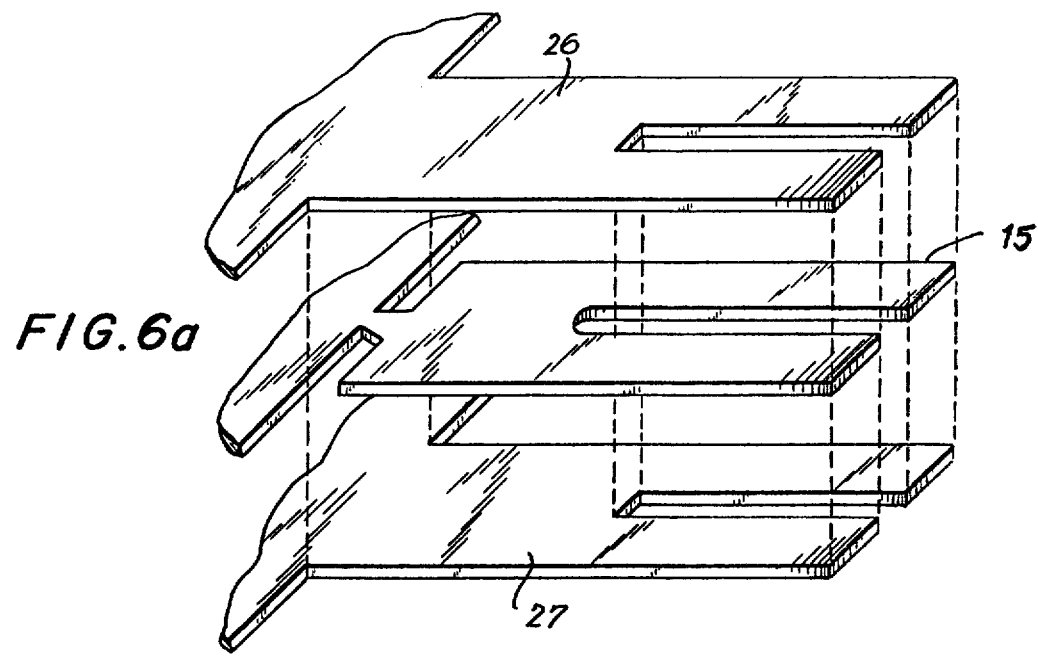
FIGS. 6a and 6b are exploded perspective and sectional views, respectively, of the manner in which the opposed planar surfaces of the vibrator are masked to form a quartz crystal vibrator in accordance with the instant invention.
Figure 6B:
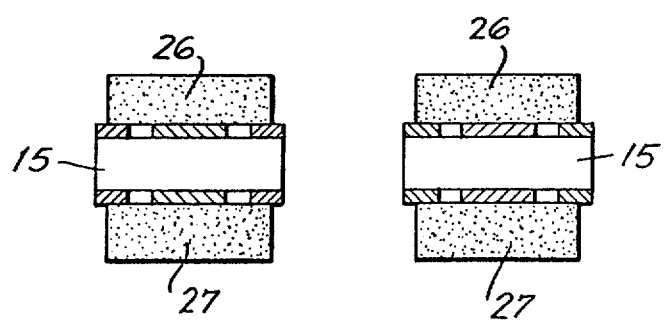

Reference is now made to FIG. 6, wherein a method for forming the side electrodes 20 and 21 on the quartz crystal. vibrator, depicted in FIGS. 4a through 4c, is illustrated. Upper and lower masks 26 and 27 are disposed on the front and rear surfaces of the photo-etched quartz crystal vibrator after the quartz crystal vibrator is photo-etched, in the manner detailed above. As illustrated in FIG. 6b, the masks 26 and 27 are formed to substantially cover the entire front and rear surfaces of the quartz crystal vibrator in order to prevent the electrodes from being short circuited by the formation of the thin film conductive electrodes on the side surfaces. Accordingly, once the masks 26 and 27 are positioned on the front and rear surfaces of the vibrator, the thin conductive films are sputtered on the side surfaces of the vibrator to thereby form the side electrodes 20 and 21, illustrated in FIGS. 4a through 4c. By masking the photo-etched vibrators and, thereafter, sputtering a thin film conductive layer on the side surfaces to form a quartz crystal vibrator in accordance with the instant invention, the following advantages inure.

First, the quartz crystal vibrators can be mass produced in batches by photo-etching. Secondly, the side electrodes are easily formed on the inner and outer side surfaces of the tuning fork tines in order to effect a coupling of the like configured electrodes on both surfaces of the vibrator. Thirdly, the advantages which inure to photo-etching are not diminished by the operation of a quartz crystal vibrator formed in this manner.

It is noted that although the instant invention has been explained with respect to the quartz crystal vibrator, illustrated in FIGS. 4a through 4c, a quartz crystal vibrator, of the type illustrated in FIGS. 2a through 2c, can be formed in accordance with the teachings of the instant invention to thereby increase the equivalent capacitance thereof. Nevertheless, such a vibrator will still not afford the improved efficiency that obtains to the quartz crystal vibrator construction illustrated in FIGS. 3a through 3c.

It will thus be seen that the objects set forth above, among those made apparent from the preceding description, are efficiently attained and, since certain changes may be made in carrying out the above method and in the constructions set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A method of forming a quartz crystal vibrator comprising the steps of coating a quartz crystal plate having opposed planar surfaces with a thin conductive film material adapted to be selectively resistant to a first predetermined etchant; coating said thin film conductive layer with a photo-resist layer to define at least a two electrode configuration on said opposed planar surfaces; applying a first etchant capable of cutting said quartz crystal plate to thereby form the shape of said quartz crystal vibrator; applying a second etchant to remove the thin film conductive material on the opposed planar surfaces of said plate that are free of said photo-resist layer and thereby define said electrode configurations on the opposed planar surfaces of said quartz crystal plate; and sputtering a thin conductive film layer on at least a portion of the side surfaces of said quartz crystal vibrator plate to electrically connect electrode configurations formed on the periphery of the opposed planar surfaces of the quartz crystal plate together.

2. A method of forming a quartz crystal vibrator as claimed in claim 1, and prior to the step of sputtering a thin conductive film layer on said side surfaces, masking substantially all of the opposed planar surfaces and electrodes formed thereon in order to prevent the masked surfaces from being sputtered with a thin conductive film when said thin conductive film layer is formed on the side surfaces.

3. A method of forming a quartz crystal vibrator as claimed in claim 2, wherein the masking is effected by a pair of masks respectively engaged against the opposed electrodes on the respective planar surfaces and dimensioned to leave the side peripheral portions of said electrodes exposed while covering the areas of said vibrator plate planar surfaces not covered by said electrodes.

* * * * *